United States Patent
Sumi (10) Patent No.: US 8,317,304 B2
(45) Date of Patent: Nov. 27, 2012

(54) LIQUID EJECTING HEAD, LIQUID EJECTING APPARATUS, AND ACTUATOR

(75) Inventor: Koji Sumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 211 days.

(21) Appl. No.: 12/722,387

(22) Filed: Mar. 11, 2010

(65) Prior Publication Data

US 2010/0245487 A1 Sep. 30, 2010

(51) Int. Cl.
*B41J 2/045* (2006.01)
(52) U.S. Cl. ............... 347/71; 347/68; 347/72
(58) Field of Classification Search .......... 347/68–72; 310/311, 330; 29/25.35; 252/62.9
See application file for complete search history.

(56) References Cited

U.S. PATENT DOCUMENTS

| | | | |
|---|---|---|---|
| 6,198,208 B1 * | 3/2001 | Yano et al. | 310/358 |
| 7,521,845 B2 | 4/2009 | Ifuku et al. | 310/358 |
| 2007/0046152 A1 | 3/2007 | Ifuku et al. | 310/358 |
| 2007/0048190 A1 | 3/2007 | Ifuku et al. | 422/100 |
| 2008/0018716 A1 * | 1/2008 | Noguchi et al. | 347/71 |
| 2008/0211880 A1 | 9/2008 | Hara et al. | 347/70 |
| 2010/0025618 A1 * | 2/2010 | Watanabe et al. | 252/62.9 R |

FOREIGN PATENT DOCUMENTS

| | | |
|---|---|---|
| CN | 1953947 A | 4/2007 |
| JP | 2005-119166 | 5/2005 |
| JP | 2007-088446 | 4/2007 |
| JP | 2007-088447 | 4/2007 |
| JP | 2007-250626 | 9/2007 |
| JP | 2008-218620 | 9/2008 |
| JP | 2008-305821 | 12/2008 |
| JP | 2009-049220 | 3/2009 |

\* cited by examiner

*Primary Examiner* — Matthew Luu
*Assistant Examiner* — Henok Legesse
(74) *Attorney, Agent, or Firm* — Kilpatrick Townsend & Stockton LLP (57) ABSTRACT

A liquid ejecting head is equipped with a piezoelectric element. The piezoelectric element has a piezoelectric layer containing titanium (Ti) and zirconium (Zr) and first and second electrodes provided on both faces of the piezoelectric layer. The composition ratio of Ti and Zr in the piezoelectric layer Ti/(Zr+Ti) is in the range of 0.50 to 0.60 both inclusive. The piezoelectric layer contains rhombohedral crystals at least in a portion thereof covering the first electrode.

7 Claims, 8 Drawing Sheets

LIQUID EJECTING HEAD, LIQUID EJECTING APPARATUS, AND ACTUATOR

The entire disclosure of Japanese Patent Application No. 2009-77841 filed Mar. 26, 2009 is expressly incorporated by reference herein.

BACKGROUND

1. Technical Field

The present invention relates to a liquid ejecting head and a liquid ejecting apparatus that eject droplets from nozzles in response to displacement of a piezoelectric element as well as an actuator equipped with a piezoelectric element.

2. Related Art

Representatives of liquid ejecting heads include ink jet recording heads, which eject ink droplets from nozzles thereof after the pressure chambers thereof is pressurized by a pressure generator. Examples of the pressure generator for ink jet recording heads include a piezoelectric element obtained by sandwiching a piezoelectric layer made of a piezoelectric material functioning as an electromechanical transducer with two electrodes. This piezoelectric element is deformed to bend, pressurizing the pressure chambers of the head, and thus the nozzles of the head eject ink droplets.

An example of the piezoelectric layer for piezoelectric elements, proposed in JP-A-2007-088446, is a monoclinic layer containing titanium (Ti) and zirconium (Zr) at an elemental ratio (composition ratio) Zr/(Zr+Ti) in the range of 0.5 to 0.8.

Another example of the piezoelectric layer, proposed in JP-A-2005-119166, is one containing Ti and Zr in which the crystal system thereof is tetragonal when the composition ratio Zr/(Zr+Ti) is approximately 0.50.

Incidentally, the crystal system of a piezoelectric layer made of a perovskite-structured material, such as lead zirconate titanate (PZT), usually depends on the composition ratio of Ti and Zr. For example, a bulk PZT piezoelectric layer, to which no external stress is applied and no restrictions are given by a substrate or the like, has a tetragonal crystal system when the composition ratio Ti/(Zr+Ti) is approximately 0.50 or higher, or when the composition ratio Zr/(Zr+Ti) is lower than approximately 0.50; however, it has a rhombohedral or monoclinic crystal system when the composition ratio Ti/(Zr+Ti) is lower than approximately 0.50. In other words, a PZT piezoelectric layer has a composition ratio Ti/(Zr+Ti) of approximately 0.50 in morphotropic phase boundaries (MPBs) between the tetragonal and rhombohedral crystals.

The piezoelectric properties of a piezoelectric layer depends not only on the composition of the layer, but also on the crystal system of the layer. However, as described above, the crystal system of a piezoelectric layer for a piezoelectric element usually changes with the composition of the layer; many literatures including the above-mentioned patent publications have proposed the composition and crystal system of a piezoelectric layer, all stating that the crystal system of the piezoelectric layer depends on the composition of the layer. Furthermore, the composition of a piezoelectric layer is limited by such factors as the relationship between the lattice constant of the piezoelectric layer and that of the base layer and thus cannot be freely adjusted; as a result, piezoelectric layers have limitations on characteristics. This has made it difficult to improve the displacement properties of a piezoelectric element by adjusting the piezoelectric properties of the piezoelectric layer. The recent demand for more improved displacement properties of piezoelectric elements is even more difficult to satisfy.

This problem is not exclusive to piezoelectric elements for ink jet recording heads; those for other liquid ejecting heads and actuators for devices other than liquid ejecting heads have also suffered from the same difficulties.

SUMMARY

An advantage of some aspects of the invention is to provide a liquid ejecting head, a liquid ejecting apparatus, and an actuator with piezoelectric element(s) built in them given improved displacement properties.

To offer the above-described advantage, a liquid ejecting head according to an aspect of the invention has a channel-forming substrate having pressure chambers communicating with nozzles for ejecting droplets as well as a piezoelectric element provided on the channel-forming substrate to change the pressure in the pressure chambers. The piezoelectric element has a piezoelectric layer containing Ti and Zr and first and second electrodes provided on both faces of the piezoelectric layer. The composition ratio of Ti and Zr in the piezoelectric layer Ti/(Zr+Ti) is in the range of 0.50 to 0.60 both inclusive. The piezoelectric layer contains rhombohedral crystals, more specifically, those resulting from phase transition of tetragonal crystals initiated by a stress applied by the base layer involved.

In this aspect of the invention, the composition ratio Ti/(Zr+Ti) is set within the indicated range, so that the piezoelectric layer has a reduced dielectric constant and bears an increased strain on polarization rotation. Also, the piezoelectric layer contains rhombohedral crystals, thus undergoing relatively large amounts of displacement. As a result, the displacement properties of the piezoelectric element, such as the amount of displacement, are improved, and it becomes possible to reduce the voltage applied to the piezoelectric element in order to mitigate the load on the power source involved.

In the case where the piezoelectric layer is a laminate of piezoelectric films, at least the piezoelectric film closest to the channel-forming substrate is preferably composed of rhombohedral crystals. This makes more certain that the displacement properties of the piezoelectric element are improved.

Additionally, the piezoelectric layer is preferably made of a perovskite-structured material, such as PZT. This allows for significant improvement of the displacement properties of the piezoelectric element.

Another aspect of the invention is a liquid ejecting apparatus equipped with the above-described liquid ejecting head; it provides a liquid ejecting apparatus with improved droplet ejection properties.

Another aspect of the invention is an actuator equipped with a piezoelectric element constituted by a piezoelectric layer containing Ti and Zr as well as first and second electrodes provided on both faces of the piezoelectric layer. The composition ratio of Ti and Zr in the piezoelectric layer Ti/(Zr+Ti) is in the range of 0.50 to 0.60 both inclusive. The piezoelectric layer contains rhombohedral crystals.

In this aspect of the invention, the composition ratio Ti/(Zr+Ti) is set within the indicated range, so that the piezoelectric layer has a reduced dielectric constant and bears an increased strain on polarization rotation. Also, the piezoelectric layer contains rhombohedral crystals, thus undergoing relatively large amounts of displacement. As a result, the displacement properties of the piezoelectric element, such as the amount of displacement, are improved, and it becomes possible to reduce the voltage applied to the piezoelectric layer in order to mitigate the load on the power source involved.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes the invention in detail with reference to embodiments of the invention.

Embodiment 1

Figure 1:
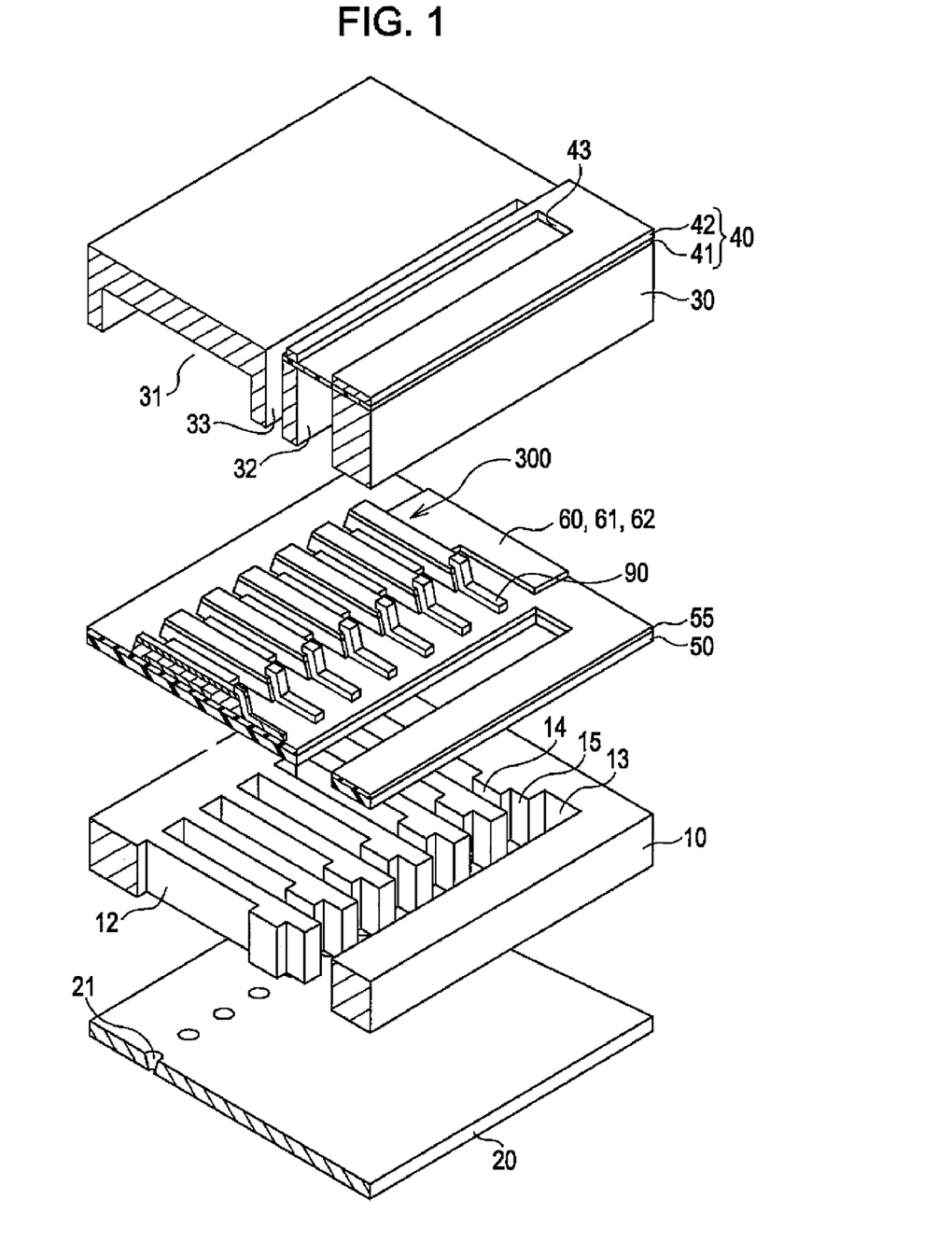
FIG. 1 is an exploded perspective diagram showing an overview of a recording head according to Embodiment 1 of the invention.
Figure 2A:
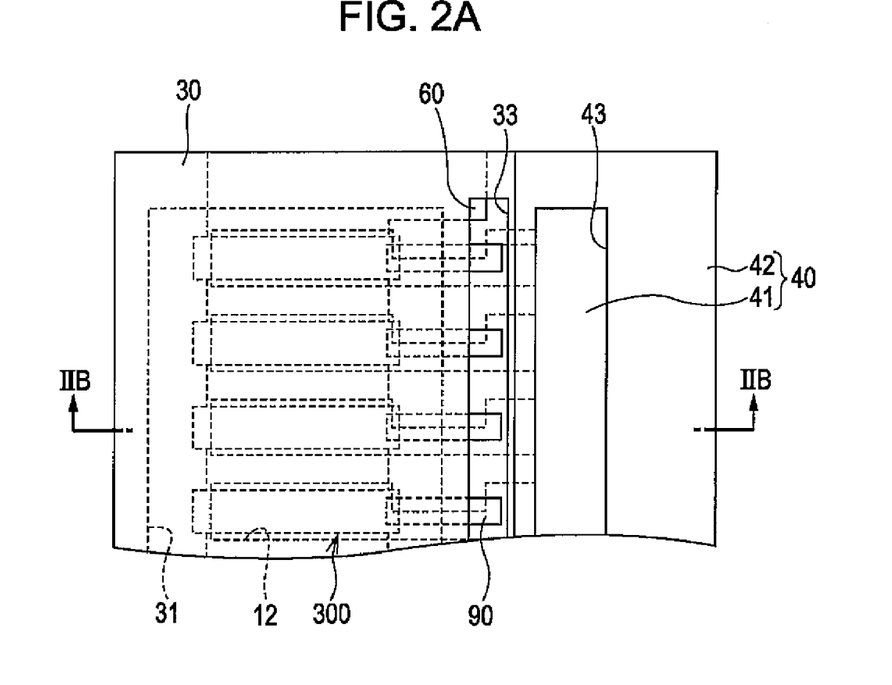
FIG. 2A is a plan view of the recording head in FIG. 1.
Figure 2B:
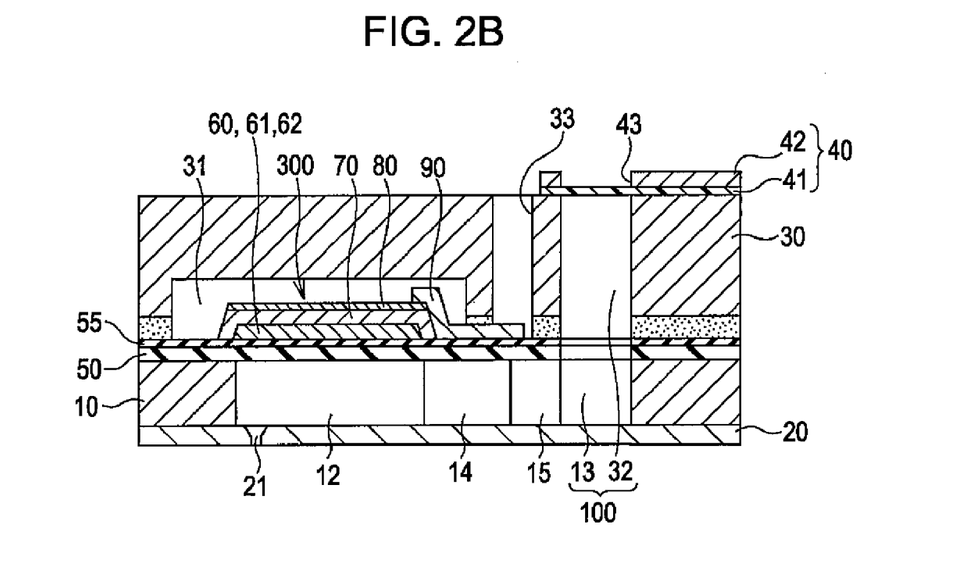
FIG. 2B is a cross-sectional view taken along line IIB-IIB of FIG. 2A.

FIG. 1 is an exploded perspective diagram showing an overview of an ink jet recording head, an example of a liquid ejecting head according to Embodiment 1 of the invention. FIG. 2A is a plan view of FIG. 1. FIG. 2B is a cross-sectional view taken along line IIB-IIB of FIG. 2A.

A channel-forming substrate 10, which is a component of the ink jet recording head, is made of a silicon single crystal oriented along the (110) direction or the like, and has pressure chambers 12 arranged thereon along the width direction as shown in FIGS. 1 and 2. One of the two portions expanding along the longitudinal ends of the pressure chambers 12 has a communicating space 13, which communicates with the pressure chambers 12 through ink supply paths 14 and communicating paths 15 formed in series next to the individual pressure chambers 12. Communicating with a reservoir space 32 of the protective substrate described later, this communicating space 13 serves as a part of a reservoir, a common ink tank for the pressure chambers 12. The ink supply paths 14 keep constant the flow resistance of ink flowing from the communicating space 13 into the pressure chambers 12; in this embodiment, they are narrower than the pressure chambers 12.

One of the two faces of the channel-forming substrate 10 is bonded to a nozzle plate 20 with an adhesive, a heat-seal film, or the like. The nozzle plate 20 has nozzles 21 formed so as to communicate with the pressure chambers 12 and is made of a glass ceramic, a silicon single crystal, stainless steel, or the like.

The other face of the channel-forming substrate 10, namely, the face opposite to that bonded to the nozzle plate 20, is coated with an elastic film 50, on which an insulating film 55 is formed; the elastic film 50 is an oxide film, while the insulating film 55 is a different kind of oxide film. This insulating film 55 has piezoelectric elements 300 arranged thereon, each of which has a first electrode 60, a piezoelectric layer 70, and a second electrode 80. Usually, a set constituted by one of the two electrodes of each piezoelectric element 300 forms a common electrode for the piezoelectric elements 300, and the remaining electrodes, together with the piezoelectric layers 70, are shaped into patterns on the area facing the pressure chambers 12, serving as separate electrodes. In this embodiment, the first electrodes 60 form a common electrode for the piezoelectric elements 300, whereas the second electrodes 80 serve as separate electrodes of the piezoelectric elements 300; however, the assignment may be reversed if so required by the circumstances of the driving circuit and wires involved.

A combination of such a piezoelectric element 300 and a diaphragm deformed by displacement of the piezoelectric element 300 is called an actuator. In the above-described embodiment, the elastic film 50, the insulating film 55, and the first electrodes 60 collectively function as diaphragms; however, no particular limitation is imposed on the diaphragm configuration. For example, diaphragms may be constituted solely by the first electrodes 60 with no elastic film 50 or insulating film 55 used, or the piezoelectric elements 300 themselves may also serve as diaphragms.

The first electrodes 60 used in this embodiment each have a conductive layer 61 and an orientation-controlling layer 62; the conductive layer 61 covers the insulating film 55, while the orientation-controlling layer 62, made of tungsten (W) or the like, covers the conductive layer 61.

The piezoelectric layers 70 are made of a piezoelectric material functioning as an electromechanical transducer. Applicable materials include perovskite-structured ferroelectric materials containing Zr and Ti, such as PZT, as well as derivatives obtained by adding niobium oxide, nickel oxide, magnesium oxide, or some other metal oxide to such ferroelectric materials. More specific examples are PZT (Pb(Zr,Ti)O$_3$), barium zirconate titanate (Ba(Zr,Ti)O$_3$), lead lanthanum zirconate titanate ((Pb,La)(Zr,Ti)O$_3$), lead zirconium titanate magnesium niobate (Pb(Zr,Ti)(Mg,Nb)O$_3$), and so forth.

Each piezoelectric layer 70 has a portion covering the orientation-controlling layer 62; at least in this portion of the piezoelectric layer 70, crystals are oriented along the (100) direction under the control of the orientation-controlling layer 62. In other words, crystals in each piezoelectric layer 70 grow epitaxially with the orientation-controlling layer 62 so as to be oriented along the (100) direction.

The piezoelectric layer 70 contains rhombohedral crystals composed of Zr and Ti, and the composition ratio Ti/(Zr+Ti) is in the range of 0.50 to 0.60 both inclusive. In general, a piezoelectric layer made of a perovskite-structured material has a tetragonal crystal system when the composition ratio, Ti/(Zr+Ti), is approximately 0.50 or higher; however, it has a rhombohedral crystal system when the composition ratio is lower than approximately 0.50. This means that a piezoelectric layer 70 according to the embodiment of the invention, in which the composition ratio Ti/(Zr+Ti) is in the range of 0.50 to 0.60 both inclusive, is a film containing not tetragonal crystals but rhombohedral crystals, although such a layer is usually a film containing tetrahedral crystals.

Specifically, the rhombohedral crystals, contained in the piezoelectric layer 70, are those resulting from phase transition of crystals existing in the piezoelectric layer 70 initiated by a stress applied by the base layer involved. For example, Embodiment 1 allows each piezoelectric layer 70 to be subjected to a predetermined compressive stress from the base layer thereof so that tetragonal and other crystals can turn into rhombohedral crystals. In other words, the piezoelectric layers 70 used in Embodiment 1 each has a higher composition ratio Ti/(Zr+Ti) than MPBs of those free from a stress, such as bulk piezoelectric layers, while being a film mainly composed of rhombohedral crystals. Note that the base layer of each piezoelectric layer 70 includes all layers closer to the channel-forming substrate 10 than the piezoelectric layer 70, covering not only the orientation-controlling layer 62 (first electrode 60) but also the insulating film 55 and other applicable layers.

In Embodiment 1, the orientation-controlling layers 62, made of a material that has a smaller lattice constant than the piezoelectric layers 70, are covered with the piezoelectric layers 70, serving as the base layers. Thus, lattice misfits occur between each pair of the orientation-controlling layers 62 and piezoelectric layers 70, so that each piezoelectric layer 70 receives a predetermined compressive stress from the base layer thereof. Tungsten (W) crystals contained in the orientation-controlling layers 62 are body-centered cubic crystals with a lattice constant of 3.16 Å; this lattice constant is considerably smaller than that of PZT, approximately 4.00 Å. This allows each piezoelectric layer 70 to receive a predetermined compressive stress from its corresponding orientation-controlling layer 62; as a result, the piezoelectric layers 70 are films mainly composed of rhombohedral crystals.

Incidentally, the "lattice constant" mentioned herein represents that in the direction of the boundary between each piezoelectric layer 70 and its corresponding first electrode 60 (a-axis or b-axis direction).

Figure 3:
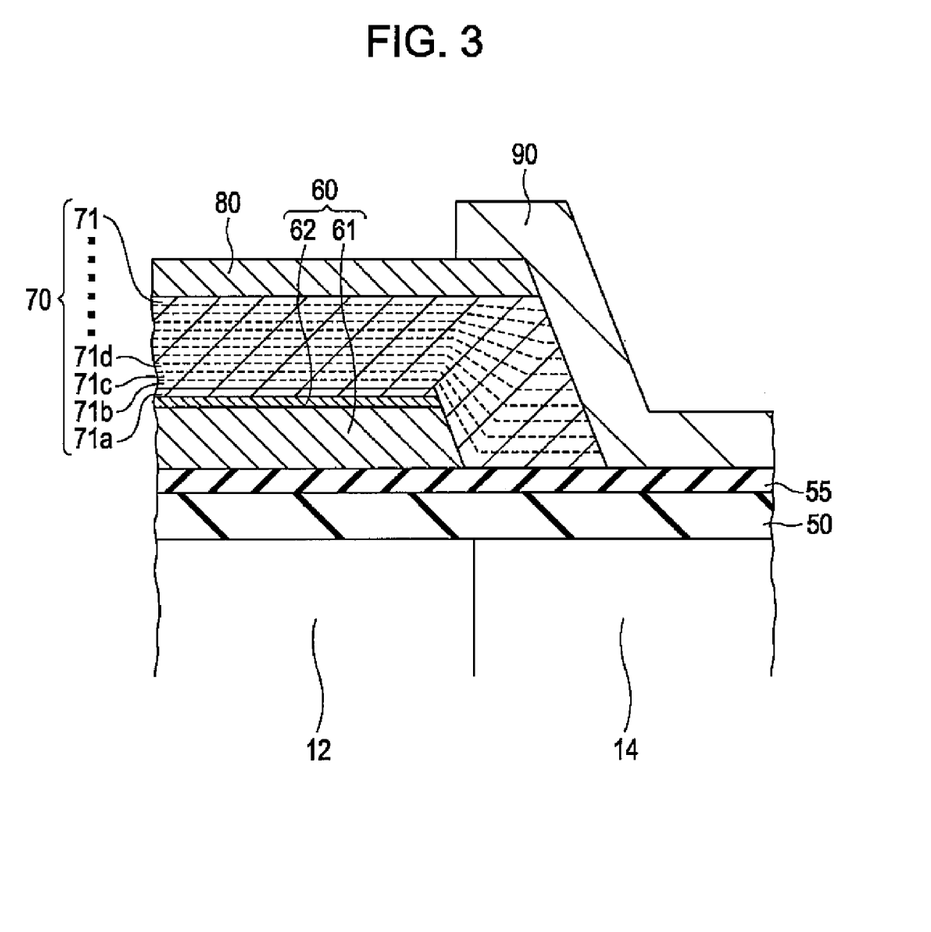
FIG. 3 is a cross-sectional view of a piezoelectric element according to Embodiment 1 of the invention.

As shown in FIG. 3, each of the piezoelectric layers 70 used in Embodiment 1 is a laminate of piezoelectric films 71 (e.g., 12 films). Under such a configuration, it is preferable that at least the piezoelectric film closest to the first electrode 60, numbered 71a, is mainly composed of rhombohedral crystals, and it is particularly preferable that films corresponding to approximately one third the thickness of the piezoelectric layer 70 are mainly composed of rhombohedral crystals. For example, in Embodiment 1, the four piezoelectric films closest to the first electrode 60, numbered 71a to 71d, are mainly composed of rhombohedral crystals because of the present of the tungsten (W) orientation-controlling layer 62.

Equipped with such piezoelectric layers 70, the piezoelectric elements 300 have significantly improved displacement properties, such as the amount of displacement. With the composition ratio Ti/(Zr+Ti) at 0.50 or higher, each piezoelectric layer 70 has a reduced dielectric constant, or a reduced capacity, and bears an increased strain on polarization rotation. Furthermore, each piezoelectric layer 70 undergoes relatively large amounts of displacement because it contains rhombohedral crystals. This means that the piezoelectric elements 300 require a lower voltage than existing ones, thereby mitigating the load on the power source involved, or that the piezoelectric elements 300 undergo greater amounts of displacement on receiving the same voltage as existing ones.

Incidentally, each of the second electrodes 80, the separate electrodes of the piezoelectric elements 300, is connected to a lead electrode 90 made of gold (Au) or some other applicable material. Each lead electrode 90 extends from the vicinity of an end of its corresponding ink supply path 14, running over the insulating film 55.

The channel-forming substrate 10, on which the piezoelectric elements 300 are formed, is covered with a protective substrate 30 bonded thereto. The protective substrate 30 has a piezoelectric element housing 31, a reservoir area 32, and a through hole 33. The piezoelectric housing 31 is a space for protecting the piezoelectric elements 300 and hollows a certain portion of the protective substrate 30 facing the piezoelectric elements 300. The reservoir space 32 communicates with the communicating space 13 to serve as a part of a reservoir 100, the common ink tank for the pressure chambers 12, as described above. The through hole 33 penetrates the thickness of the protective substrate 30; each lead electrode 90, extending from its corresponding piezoelectric element 300, has a portion exposed in the through hole 33 near an end thereof.

The protective substrate 30 has a driving circuit fixed thereon for driving the piezoelectric elements 300, and the driving circuit is electrically connected to the lead electrodes 90 via a conductive bonding wire or the like (not shown in the drawings). Additionally, the protective substrate 30 has a compliance substrate 40 bonded thereto. The compliance substrate 40 includes a sealing film 41 and a stationary plate 42, and the sealing film 41 is made of a flexible material with a low rigidity and seals the upper opening of the reservoir space 32, whereas the stationary plate 42 is made of a harder material and has an opening 43 penetrating the whole thickness thereof over the area corresponding to the reservoir 100. Thus, the upper opening of the reservoir 100 is sealed only with the flexible sealing film 41.

Under this configuration, an ink jet recording head according to Embodiment 1 receives ink from an external ink source (not shown in the drawings) via an ink inlet connected to the ink source, fills the entire space from the reservoir 100 to the nozzles 21 with the ink, and then, in response to recording signals transmitted from the driving circuit, applies voltage to the piezoelectric elements 300 so that they are deformed to bend; as a result, the pressure chambers 12, arranged in correspondence with the piezoelectric elements 300, are pressurized and then eject ink droplets through the nozzles 21.

Figure 4A:
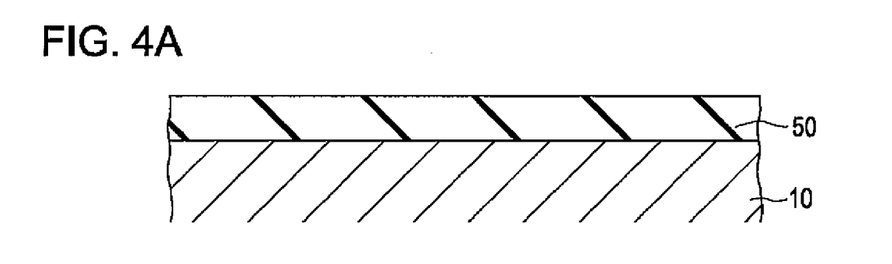
FIGS. 4A to 4C are cross-sectional diagrams showing a method for manufacturing a recording head according to Embodiment 1.
Figure 4B:
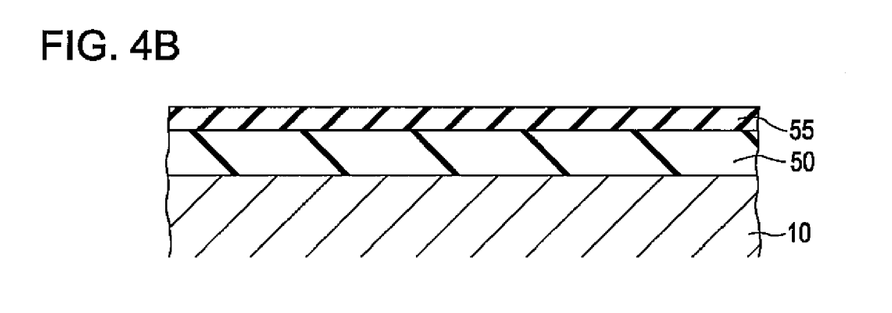
Figure 4C:
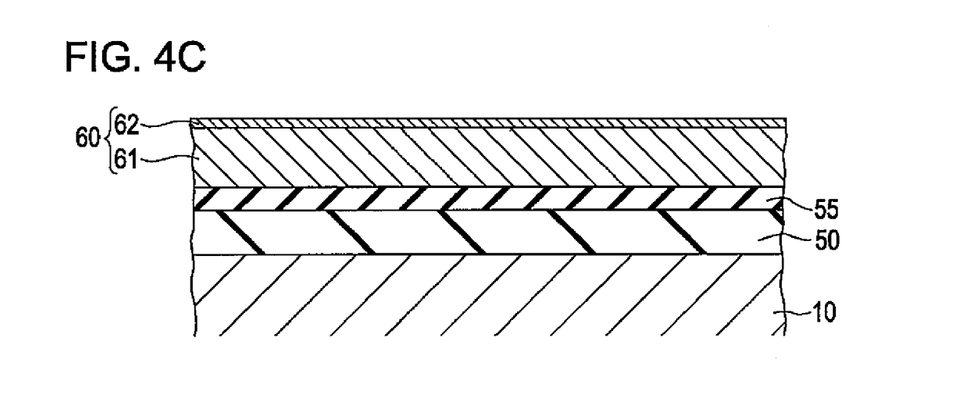
Figure 5A:
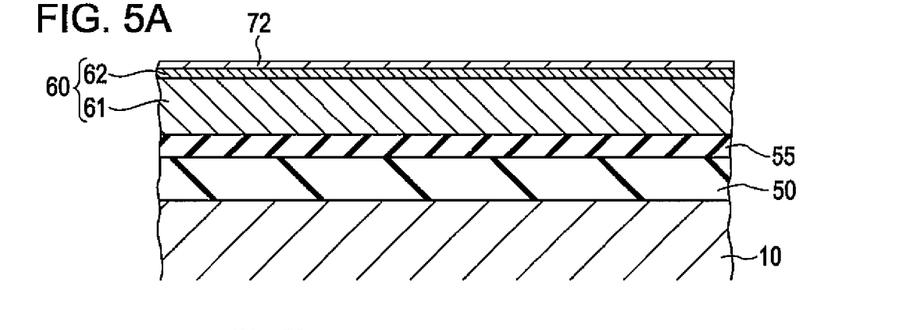
FIGS. 5A to 5D are cross-sectional diagrams showing a method for manufacturing a recording head according to Embodiment 1.

The following describes an example method for manufacturing such an ink jet recording head, more specifically, an example method for manufacturing a piezoelectric element 300 serving as a part of an actuator. FIGS. 4 to 6 individually include cross-sectional diagrams showing a method for manufacturing an ink jet recording head according to Embodiment 1 of the invention.

First, as shown in FIG. 4A, a channel-forming substrate 10, which is made of silicon or the like, is oxidized by heat treatment so as to be coated with an elastic film 50, which is made of silicon dioxide ($SiO_2$) or the like. Then, as shown in FIG. 4B, an insulating film 55, which is made of zirconium oxide or the like, is formed on the elastic film 50 until the thickness thereof is on the order of 100 to 500 nm. Then, as shown in FIG. 4C, a first electrode 60 is formed on the insulating film 55. An example of specific methods is as follows. A conductive layer 61, which is made of platinum (Pt), iridium (Ir), or the like, is formed on the insulating film 55 by sputtering or some other methods until the thickness thereof is on the order of 20 to 80 nm. Then, an orientation-controlling layer 62, which is made of tungsten (W) or the like, is formed on the conductive film 61 by sputtering or some other methods until the thickness thereof is on the order of 5 to 20 nm.

Then, a piezoelectric layer 70 is formed. In Embodiment 1, a metal-oxide-based piezoelectric layer 70 is formed by the sol-gel method, in which a metal organic compound is dissolved or dispersed in a solvent, the resultant sol is applied to the base surface and then dried, and then the resultant gel is burnt at a high temperature. Meanwhile, the piezoelectric layer 70 may be formed by metal-organic decomposition (MOD), sputtering, or some other possible method.

An example of specific methods for producing the piezoelectric layer 70 is as follows. First, as shown in FIG. 5A, a piezoelectric precursor film 72, a precursor of the piezoelectric layer 70, is formed on the first electrode 60; in other words, a sol (solution) containing Ti and Zr is applied to the orientation-controlling layer 62 (application). Then, the piezoelectric precursor film 72 is dried at a certain temperature for a certain period of time (drying); for example, the piezoelectric precursor film 72 is maintained at a temperature in the range of 150 to 170° C. for a period in the range of 5 to 10 minutes. Then, the piezoelectric precursor film 72 dried is heated at a certain temperature for a period of time until fat is completely removed (defatting); for example, the piezoelectric precursor film 72 is maintained at a temperature on the order of 300 to 400° C. for a period on the order of 5 to 10 minutes. Note that the "defatting" mentioned herein represents removing organic components from the piezoelectric precursor film 72 by converting them into $NO_2$, $CO_2$, $H_2O$, or some other form. In defatting, the heating rate is preferably set at 15° C./sec or higher.

Figure 5B:
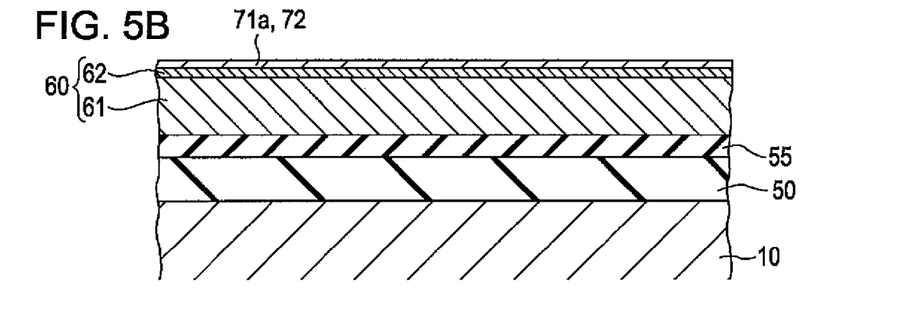
Figure 6A:
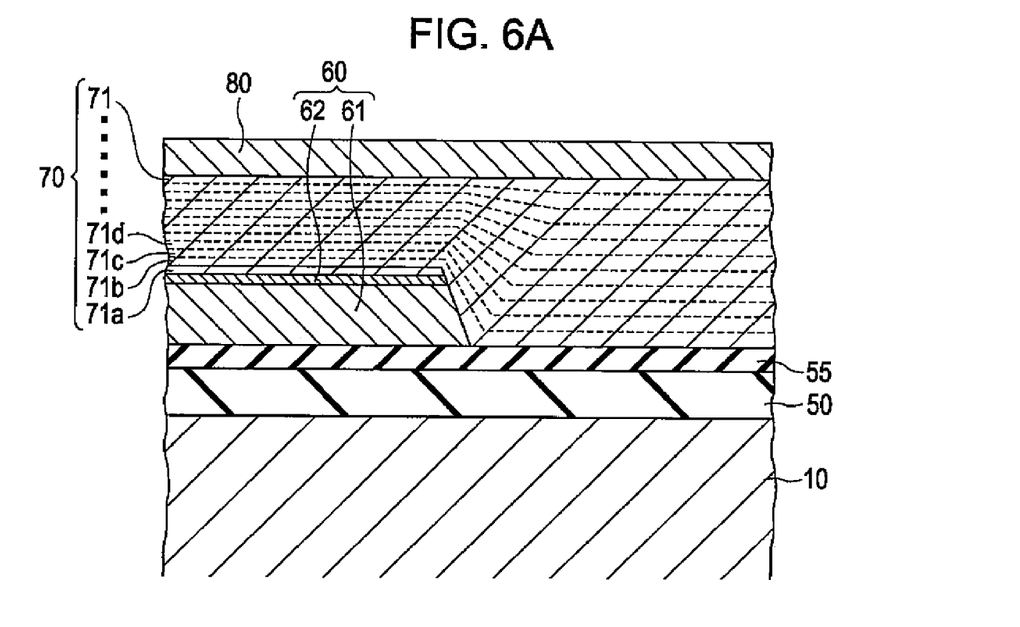
FIGS. 6A and 6B are cross-sectional diagrams showing a method for manufacturing a recording head according to Embodiment 1.
Figure 6B:
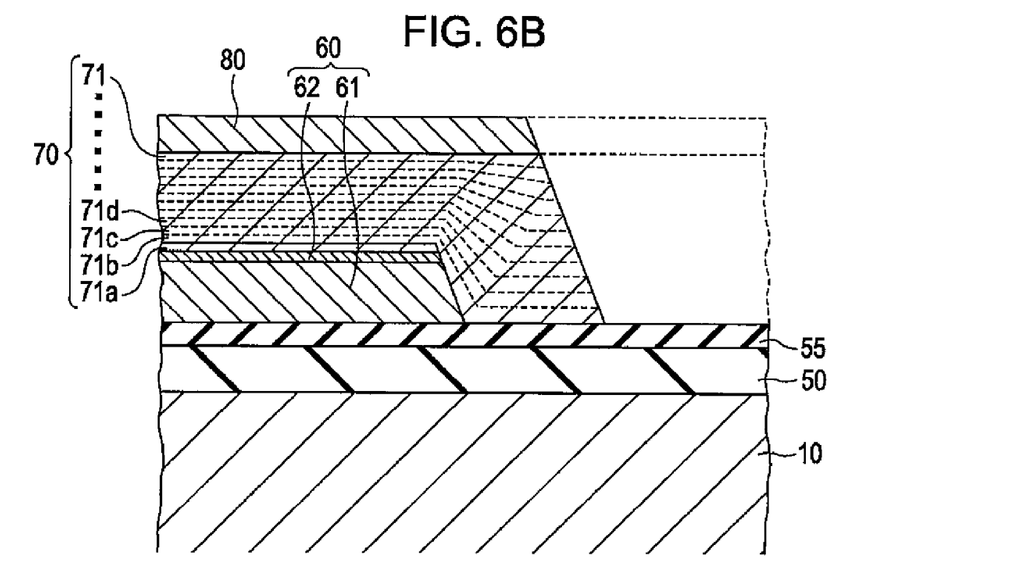

Then, as shown in FIG. 5B, a first piezoelectric film 71a is formed by maintaining the piezoelectric precursor film 72 at a certain temperature for a period of time until crystallization (burning); for example, the piezoelectric precursor film 72 is maintained at a temperature in the range of 650 to 800° C. for a period in the range of 5 to 30 minutes. The heating rate is preferably set at 15° C./sec or lower.

Figure 5C:
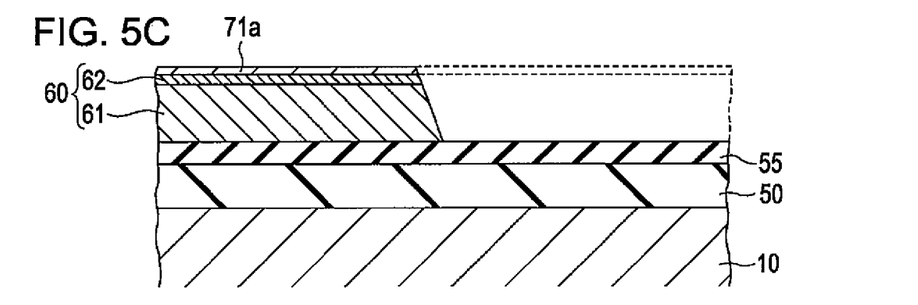
Figure 5D:
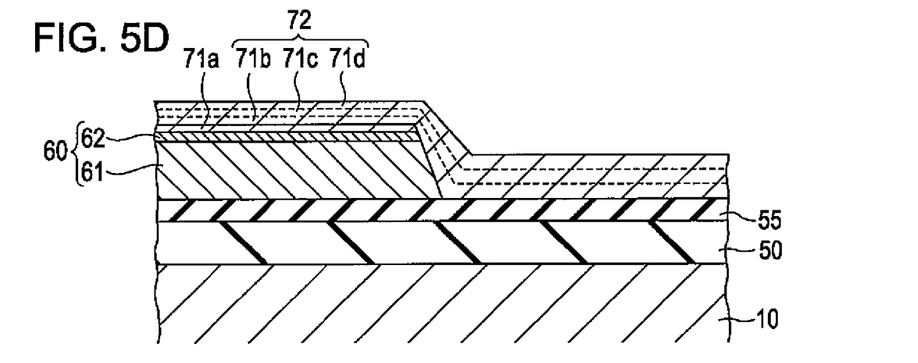

Then, as shown in FIG. 5C, the first electrode 60 and the first piezoelectric film 71a are simultaneously patterned into a predetermined shape. After that, the above-described application, drying, and defatting are repeated until second to fourth piezoelectric precursor films 72 are formed on the entire surface of the channel-forming substrate 10 including the first piezoelectric film 71a. These piezoelectric precursor films 72 are simultaneously heated until crystallization; in this way, piezoelectric films 71b to 71d are formed (burning). This process for crystallizing the piezoelectric precursor films 72 is repeated until the piezoelectric layer 70 contains several piezoelectric films 71 (e.g., 12 films).

Produced as above, the piezoelectric layer 70 has a portion that covers the orientation-controlling layer 62. This portion is subjected to a predetermined compressive stress from the base layer, the orientation-controlling layer 62, due to lattice misfits. Thus, the piezoelectric layer 70 is a film containing rhombohedral crystals, although it has a composition ratio Ti/(Zr+Ti) in the range of 0.50 to 0.60 both inclusive. In addition, the compressive stress applied to the piezoelectric layer 70 can be adjusted by, for example, changing the material of the orientation-controlling layer 62. Besides tungsten (W), the orientation-controlling layer 62 can be made of tantalum (Ta), nickel (Ni), or some other applicable material.

At least in this portion of the piezoelectric layer 70, namely, the portion covering the orientation-controlling layer 62, crystals are oriented along the (100) direction under the control of the orientation-controlling layer 62. In other words, crystals in the piezoelectric layer 70 formed as above grow epitaxially with the orientation-controlling layer 62 so as to be oriented along the (100) direction.

Then, as shown in FIG. 6A, a second electrode 80, which is made of iridium (Ir) or the like, is formed on the piezoelectric layer 70. Then, as shown in FIG. 6D, the piezoelectric layer 70 and the second electrode 80 are patterned so as to correspond to the individual pressure chambers 12. In this way, a piezoelectric element 300 is completed.

As described above, Embodiment 1 employs lattice misfits between each pair of the orientation-controlling layers 62 and piezoelectric layers 70 for the purpose that the piezoelectric layers 70 are subjected to a compressive stress from their corresponding orientation-controlling layers 62. However, this purpose can be achieved also by, for example, preparing each base layer, which contains the first electrode 60, the insulating film 55, and some other layers, from a material with a linear expansion coefficient higher than that of the piezoelectric layers 70 and then burning and cooling the piezoelectric layers 70. This means that, in producing the piezoelectric element 300, the compressive stress that the piezoelectric layers 70 receive from their corresponding base layers can be adjusted by changing the material and thickness of the first electrode 60, insulating film 55, and other layers contained in the base layers, modifying the composition of the piezoelectric layers 70, and controlling the burning temperature and other production conditions. This is the reason why the piezoelectric layer 70 can be a film containing rhombohedral crystals despite that it has a composition ratio Ti/(Zr+Ti) in the range of 0.50 to 0.60 both inclusive.

Figure 7:
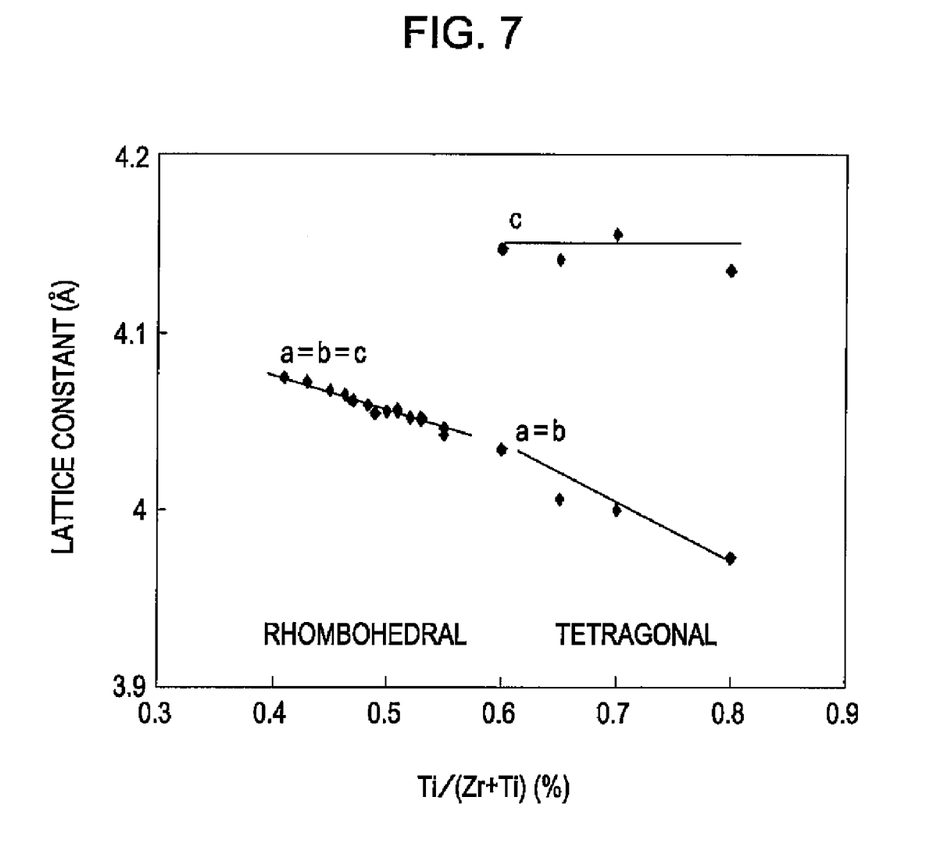
FIG. 7 is a graph showing the relationship between the composition ratio Ti/(Zr+Ti) in a piezoelectric layer and the lattice constant.

The following describes how the lattice constant varies with the composition ratio Ti/(Zr+Ti) in piezoelectric layers 70 produced under the same production conditions. FIG. 7 is a graph showing the relationship between the composition ratio Ti/(Zr+Ti) and the lattice constant.

Note that the lattice constant of a piezoelectric layer is based on measurements obtained by two methods: out-of-plane X-ray diffractometry (XRD) and in-plane XRD. The procedure for producing the piezoelectric layers 70 was as follows. First, a zirconium-oxide-based insulating film 55 was formed on a substrate with the thickness thereof being approximately 300 nm. Platinum (Pt) was sputtered on the insulating film 55, and then iridium (Ir) was sputtered on the Pt layer; in this way, a conductive layer 61 was formed. The thickness of the Ir and Pt layers were 10 nm and 50 nm, respectively. An orientation-controlling layer 62 based on tungsten (W) was formed on the conductive layer 61 with the thickness thereof being approximately 10 nm by means of ion-beam-assisted sputtering, which allowed W crystals to be oriented along the (100) direction, namely, the thickness direction. A metal organic compound sol, which is obtained by dissolving or dispersing the compound into a solvent, was applied to the orientation-controlling layer 62, dried, and then heated at 400° C. so as to turn into a gel. The gel was burnt by rapid thermal annealing (RTA) at 750° C. In this way, metal-oxide-based piezoelectric layers 70 were obtained.

As shown in FIG. 7, composition ratios Ti/(Zr+Ti) of approximately 0.6 or lower resulted in piezoelectric layers 70 with the lattice constant being almost the same among the a-, b-, and c-axis of the crystal lattice (a=b=c), whereas higher composition ratios results in outlying c-axis lattice constants (a=b<c). This result demonstrates that the piezoelectric layer 70 is a film mainly composed of rhombohedral crystals when the composition ratio Ti/(Zr+Ti) is approximately 0.60 or lower and is a film mainly composed of tetragonal crystals when the composition ratio is higher. Thus, the compressive stress that a piezoelectric layer 70 receives from its base layer can be adjusted so that the piezoelectric layer 70 be mainly composed of rhombohedral crystals while maintaining the composition ratio Ti/(Zr+Ti) in the range of 0.50 to 0.60 both inclusive.

Other Embodiments

The invention is never limited to the above-described embodiment. For example, an embodiment using no orientation-controlling layer 62 is possible as long as it employs appropriate materials of the conductive layer 61, insulating film 55, and other components of the first electrode 60 and appropriate production conditions for ensuring that the resultant piezoelectric element 300 can receive a necessary compressive stress. This can be achieved also by inserting an additional layer between the insulating film 55 and the first electrode 60 in order to control the compressive stress applied to the piezoelectric layers 70.

The crystals existing in the piezoelectric layers 70 may be oriented along the (110), (001), or (111) direction rather than the (100) direction. Furthermore, the material of the channel-forming substrate 10 does not always have to be a silicon single crystal; it may be SOI, glass, or some other material that is chosen in consideration of the stress applied to the piezoelectric layers 70.

Figure 8:
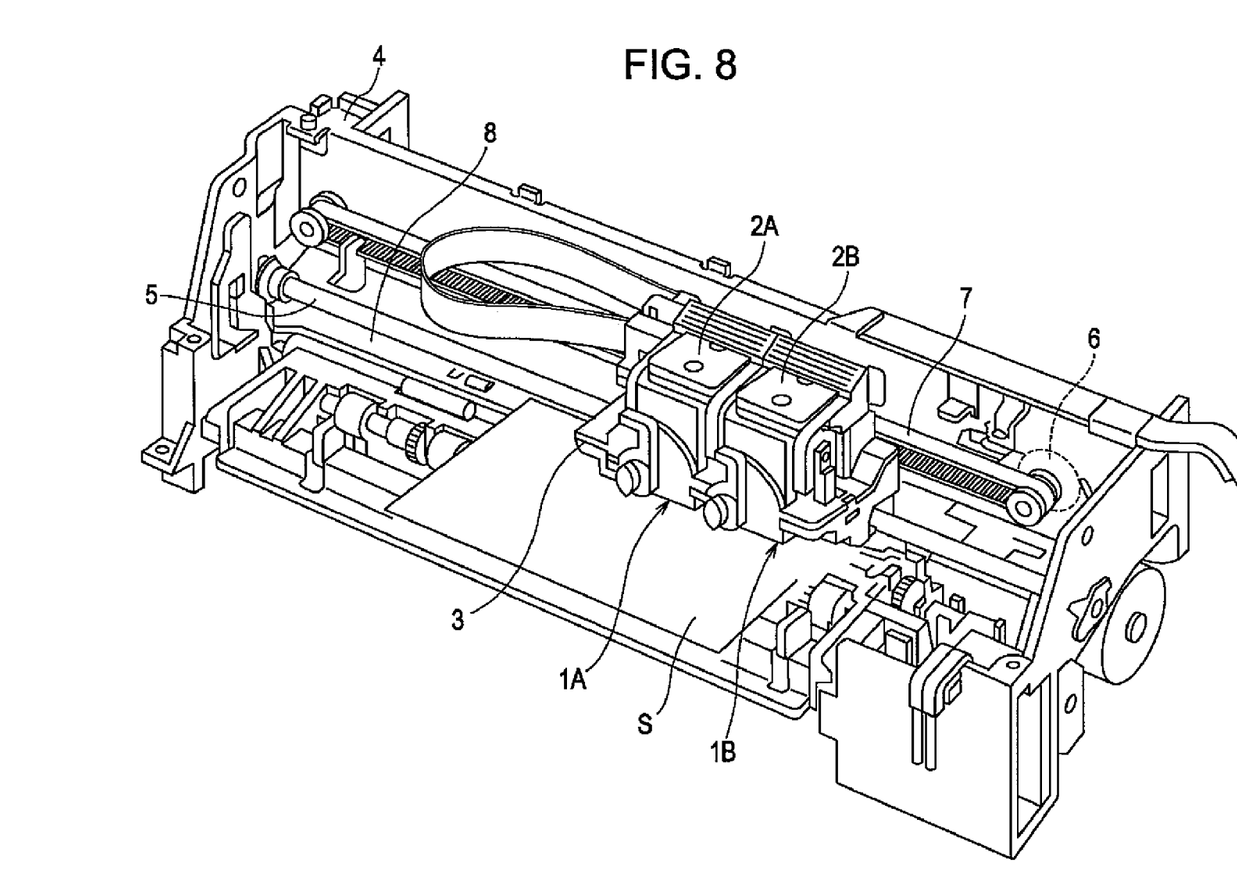
FIG. 8 is a diagram showing an overview of a recording apparatus according to an embodiment of the invention.

The above-described ink jet recording head serves as a part of a recording head unit equipped with an ink channel communicating with an ink cartridge or the like, and this recording head unit can be mounted in an ink jet recording apparatus. In FIG. 8, recording head units 1A and 1B, each having an ink jet recording head, are equipped with detachable cartridges 2A and 2B serving as ink sources. A carriage 3 carries the recording head units 1A and 1B and can freely move along a carriage shaft 5 built in a main unit 4. In an possible configuration, the recording head units 1A and 1B discharge a black ink composition and a color ink composition, respectively.

A motor 6 is driven, and the generated force is transmitted via gears (not shown in the drawing) and a timing belt 7 to the carriage 3; as a result, the carriage 3 moves along the carriage shaft 5. Recording sheets S, which are sheets of paper or some other recording medium, are fed by a sheet-feeding roller (not shown in the drawing) and then transported by a platen 8 built in the main unit 4 so as to extend along the carriage shaft 5.

Although Embodiment 1 deals with an ink jet recording head and a liquid ejecting apparatus as an example of liquid ejecting heads and liquid ejecting apparatus according to the invention, the invention covers various kinds of liquid ejecting heads and liquid ejecting apparatus. Thus, the invention can be applied also to a liquid ejecting head that discharges a liquid other than ink. Other applicable liquid ejecting heads include recording heads for a printer or other kinds of image recording apparatus, colorant ejecting heads for manufacturing of liquid crystal displays or other kinds of color filters, electrode material ejecting heads for forming electrodes for organic EL displays, field emission displays (FEDs), or the like, bioorganic substance ejecting heads for manufacturing of biochips, and so forth.

Furthermore, the invention can be applied also to various actuators; an actuator produced in accordance with the invention can be used not only in liquid ejecting heads represented by an ink jet recording head, but also in other kinds of apparatus.

What is claimed is:

1. A liquid ejecting head comprising:
   a channel-forming substrate comprising a pressure chamber communicating with a nozzle for ejecting a droplet; and
   a piezoelectric element provided on the channel-forming substrate to change a pressure in the pressure chamber, wherein:
   the piezoelectric element comprises a piezoelectric layer comprising titanium (Ti) and zirconium (Zr), a first electrode provided on one side face of the piezoelectric layer, and a second electrode provided on an opposite side face of the piezoelectric layer;
   the first electrode comprises a conductive layer and an orientation-controlling layer comprising tungsten, wherein the orientation-controlling layer is disposed between the conductive layer and the piezoelectric layer;
   the composition ratio of Ti and Zr in the piezoelectric layer Ti/(Zr+Ti) is in the range of 0.50 to 0.60 both inclusive; and
   approximately one third the thickness of the piezoelectric layer is composed of rhombohedral crystals.

2. The liquid ejecting head according to claim 1, wherein the rhombohedral crystals of the piezoelectric layer result from phase transition initiated by a stress applied by a base layer of the piezoelectric layer.

3. The liquid ejecting head according to claim 1, wherein the piezoelectric layer is a laminate of piezoelectric films.

4. The liquid ejecting head according to claim 1, wherein the piezoelectric layer comprises a perovskite-structured material.

5. The liquid ejecting head according to claim 1, wherein the piezoelectric layer comprises lead zirconate titanate (PZT).

6. A liquid ejecting apparatus comprising the liquid ejecting head according to any one of claims 1 to 5.

7. An actuator comprising:
   a piezoelectric element comprising a piezoelectric layer comprising titanium (Ti) and zirconium (Zr), a first electrode provided on one face side of the piezoelectric layer, and a second electrode provided on an opposite side face of the piezoelectric layer, wherein:
   the first electrode comprises a conductive layer and an orientation-controlling layer comprising tungsten, wherein the orientation-controlling layer is disposed between the conductive layer and the piezoelectric layer;
   the composition ratio of Ti and Zr in the piezoelectric layer Ti/(Zr+Ti) is in the range of 0.50 to 0.60 both inclusive; and
   approximately one third the thickness of the piezoelectric layer is composed of rhombohedral crystals.

* * * * *